(12) United States Patent
Jin et al.

(10) Patent No.: US 11,665,824 B2
(45) Date of Patent: *May 30, 2023

(54) POWER CONVERTER MODULE

(71) Applicant: Delta Electronics, Inc., Taoyuan (TW)

(72) Inventors: Da Jin, Taoyuan (TW); Shengli Lu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 8 days.

This patent is subject to a terminal disclaimer.

(21) Appl. No.: 17/571,020

(22) Filed: Jan. 7, 2022

(65) Prior Publication Data

US 2022/0132668 A1  Apr. 28, 2022

Related U.S. Application Data

(63) Continuation of application No. 17/147,219, filed on Jan. 12, 2021, now Pat. No. 11,252,820.

(30) Foreign Application Priority Data

Oct. 27, 2020  (CN) .......................... 202011164463.3
Nov. 9, 2020   (CN) .......................... 202011239669.8

(51) Int. Cl.
  *H05K 1/16*  (2006.01)
  *H05K 1/11*  (2006.01)

(52) U.S. Cl.
  CPC ............. *H05K 1/165* (2013.01); *H05K 1/115* (2013.01); *H05K 2201/10015* (2013.01); *H05K 2201/10053* (2013.01)

(58) Field of Classification Search
  CPC ................... H05K 1/165; H05K 1/115; H05K 2201/10053; H05K 2201/10015
  USPC .......................................................... 361/736
  See application file for complete search history.

(56) References Cited

U.S. PATENT DOCUMENTS 10,185,141 B2*  1/2019  Wang ..................... H02G 5/007
10,701,795 B2*  6/2020  Pando Rodriguez ........................ H05K 3/4644

* cited by examiner

*Primary Examiner* — Sherman Ng
(74) *Attorney, Agent, or Firm* — Kirton McConkie; Evan R. Witt

(57) ABSTRACT

An apparatus includes a substrate, a switching device, a capacitor device, a first via, a second via, a third via and a fourth via. The substrate has a first surface and a second surface and includes a plurality of copper layers including M positive copper layers and N negative copper layers. The M positive copper layers and the N negative copper layers are alternated. The switching device is disposed on the first surface and includes a switching positive terminal and a switching negative terminal. The capacitor device is disposed on the first surface and includes a capacitor positive terminal and a capacitor negative terminal, and the capacitor device forms a capacitor area. The projections of the adjacent positive and negative copper layers and the capacitor area on the first surface at least partially overlap with each other.

18 Claims, 7 Drawing Sheets

POWER CONVERTER MODULE

CROSS-REFERENCE TO RELATED APPLICATION

This application is a Continuation Application of U.S. patent application Ser. No. 17/147,219 filed on Jan. 12, 2021 and entitled "POWER CONVERTER MODULE", which claims priorities to China Patent Application No. 202011164463.3, filed on Oct. 27, 2020 and China Patent Application No. 202011239669.8, filed on Nov. 9, 2020. The entireties of the above-mentioned patent applications are incorporated herein by reference for all purposes.

FIELD OF THE INVENTION

The present disclosure relates to a power converter module, and more particularly to a power converter module with a plurality of positive copper layers and a plurality of negative copper layers staggered.

BACKGROUND OF THE INVENTION

With the rapid development of technologies such as mobile communications and cloud computing, high-power power converter modules have been widely used in electronic products. Due to the trend of high power and miniaturization of electronic products, how to improve the conversion efficiency of the power converter module and reduce the size of the power converter module is the primary consideration.

As the output power of the existing power converter module increases, the large current in the power converter module causes more and more losses in the corresponding current loop and flow path, and the proportion of this loss in the total loss of the power converter module also increases. In order to reduce the loss on the transmission path, multiple copper layer wirings in the multilayer printed circuit board are often connected in parallel to reduce the equivalent impedance of the flow path. However, due to the existence of parasitic parameters between multiple copper layers and the AC loop in the power converter module. This increases the AC loss of the AC current in the corresponding AC circuit, thereby reducing the conversion efficiency of the power conversion module.

Therefore, there is a need of providing a power converter module to obviate the drawbacks encountered from the prior arts.

SUMMARY OF THE INVENTION

It is an object of the present disclosure to provide an apparatus. By staggering a plurality of positive copper layers and a plurality of negative copper layers, and the positive copper layers and the plurality of negative copper layers are electrically connected to the corresponding switching positive and negative terminals, the capacitor positive and negative terminals, and a plurality of vias respectively. The projections of the adjacent positive and negative copper layers and capacitor area on the first surface partially overlap with each other, thereby reducing the parasitic inductance of the wiring and reducing the parasitic loss. Therefore, the conversion efficiency of the power conversion apparatus is improved.

In accordance with an aspect of the present disclosure, there is provided an apparatus. The apparatus includes a substrate, at least one switching device, at least one capacitor device, at least one first via, at least one second via, at least one third via and at least one fourth via. The substrate has a first surface and a second surface, the first surface and the second surface are opposite, the substrate includes a plurality of copper layers, the plurality of copper layers includes M positive copper layers and N negative copper layers, and the M positive copper layers and the N negative copper layers are alternated, wherein M is equal to or greater than one, N is equal to or greater than one, and the sum of M and N is equal to or greater than three. The switching device is disposed on the first surface of the substrate and includes a switching positive terminal and a switching negative terminal. The capacitor device is disposed on the first surface of the substrate and includes a capacitor positive terminal and a capacitor negative terminal, and the at least one capacitor device forms a capacitor area. The first via is electrically connected to the switching positive terminal, the second via is electrically connected to the switching negative terminal, the third via is electrically connected to the capacitor positive terminal, and the fourth via is electrically connected to the capacitor negative terminal. The positive copper layers are electrically connected to the first via and the third via, and the negative copper layers are electrically connected to the second via and the fourth via. A dielectric layer is disposed between the two adjacent copper layers. The projections of the adjacent positive and negative copper layers and capacitor area on the first surface at least partially overlap with each other.

In accordance with an aspect of the present disclosure, there is provided a manufacturing method of an apparatus. The manufacturing method of an apparatus comprises steps: providing a substrate having a first surface and a second surface opposite to each other, wherein the substrate comprises a plurality of copper layers, the plurality of copper layers comprises M positive copper layers and N negative copper layers, and the positive copper layers and the negative copper layers are alternated, wherein M is equal to or greater than one, N is equal to or greater than one, and the sum of M and N is equal to or greater than three; providing at least one switching device disposed on the first surface of the substrate, wherein the switching device comprises a switching positive terminal and a switching negative terminal; providing at least one capacitor assembly disposed on the first surface of the substrate, wherein the capacitor assembly comprises a capacitor positive terminal and a capacitor negative terminal, and the at least one capacitor assembly forms a capacitor area; providing at least one first via, at least one second via, at least one third via and at least one fourth via, wherein the first via is electrically connected to the switching positive terminal, the second via is electrically connected to the switching negative terminal, the third via is electrically connected to the capacitor positive terminal, and the fourth via is electrically connected to the capacitor negative terminal, wherein the positive copper layers are electrically connected to the first via and the third via, and the negative copper layers are electrically connected to the second via and the fourth via; wherein projections of the adjacent positive and negative copper layers and the capacitor area on the first surface at least partially overlap with each other.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
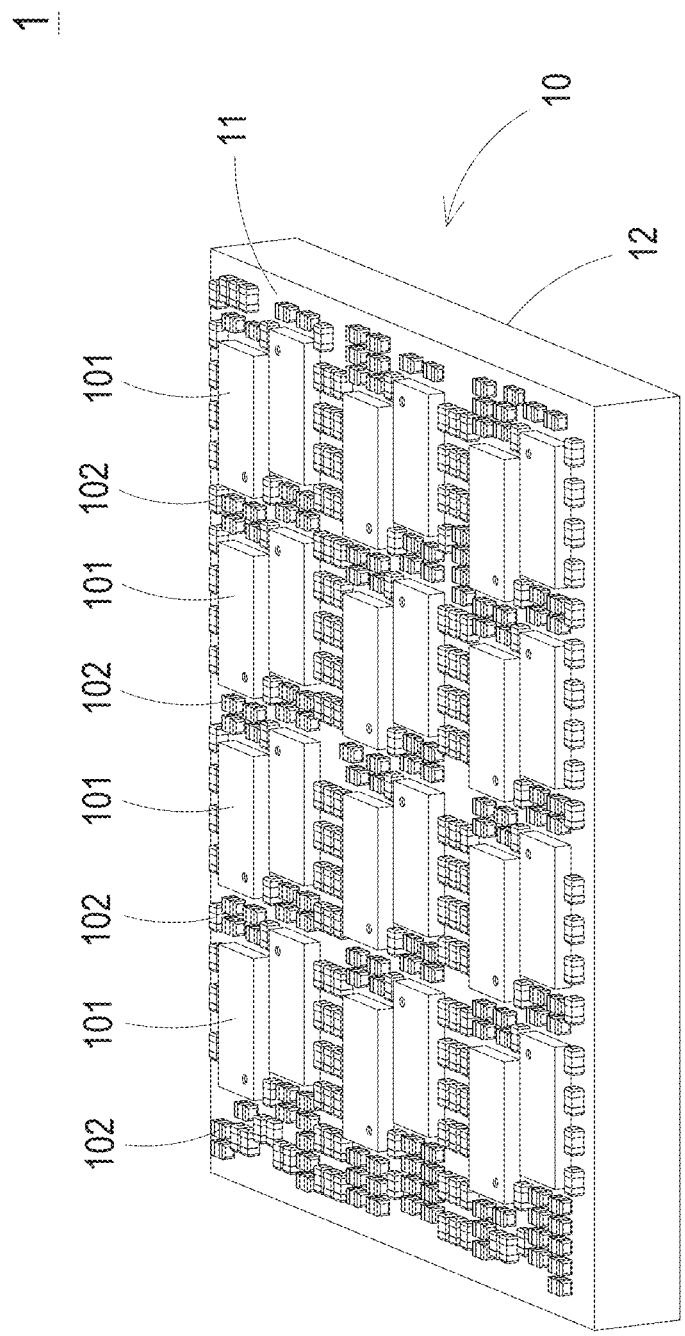
FIG. 1 is a schematic perspective view illustrating a power converter module according to an embodiment of the present disclosure.
Figure 2:
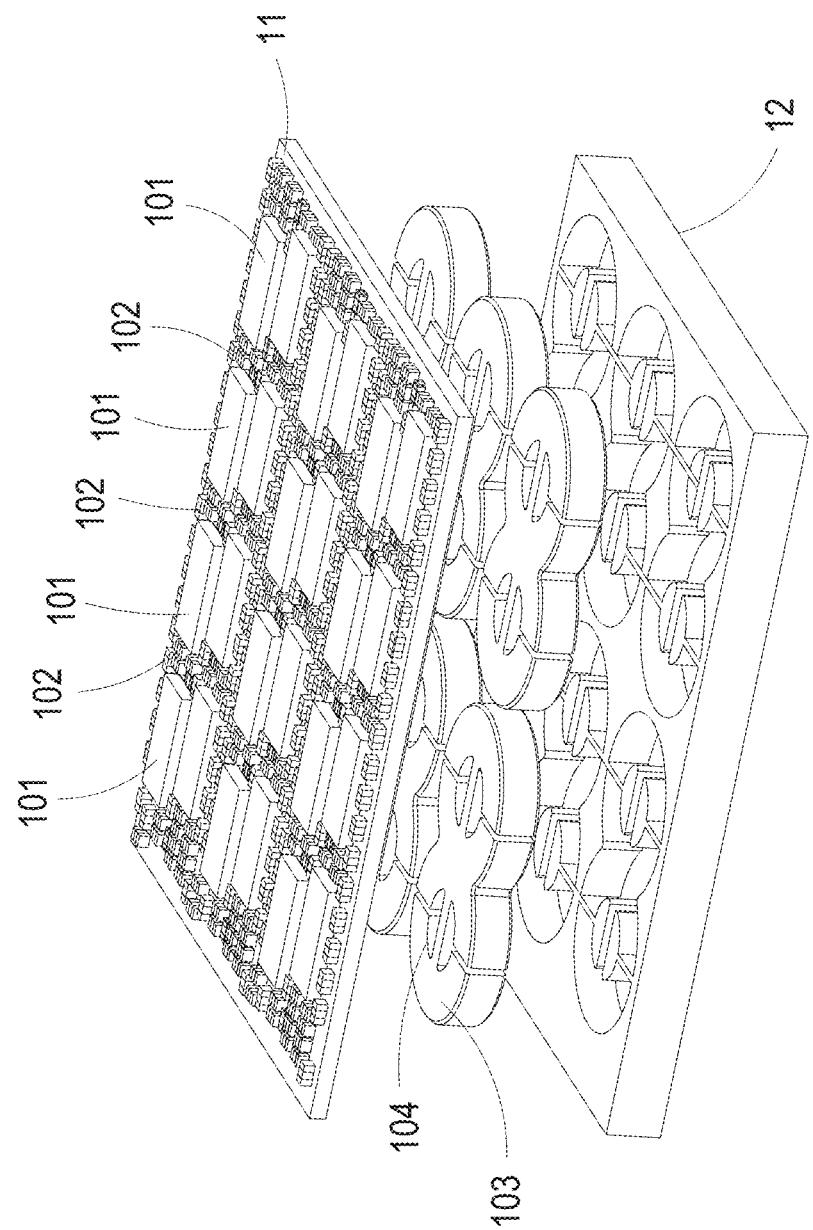
FIG. 2 is an exploded view illustrating the power converter module according to the embodiment of the present disclosure.
Figure 3:
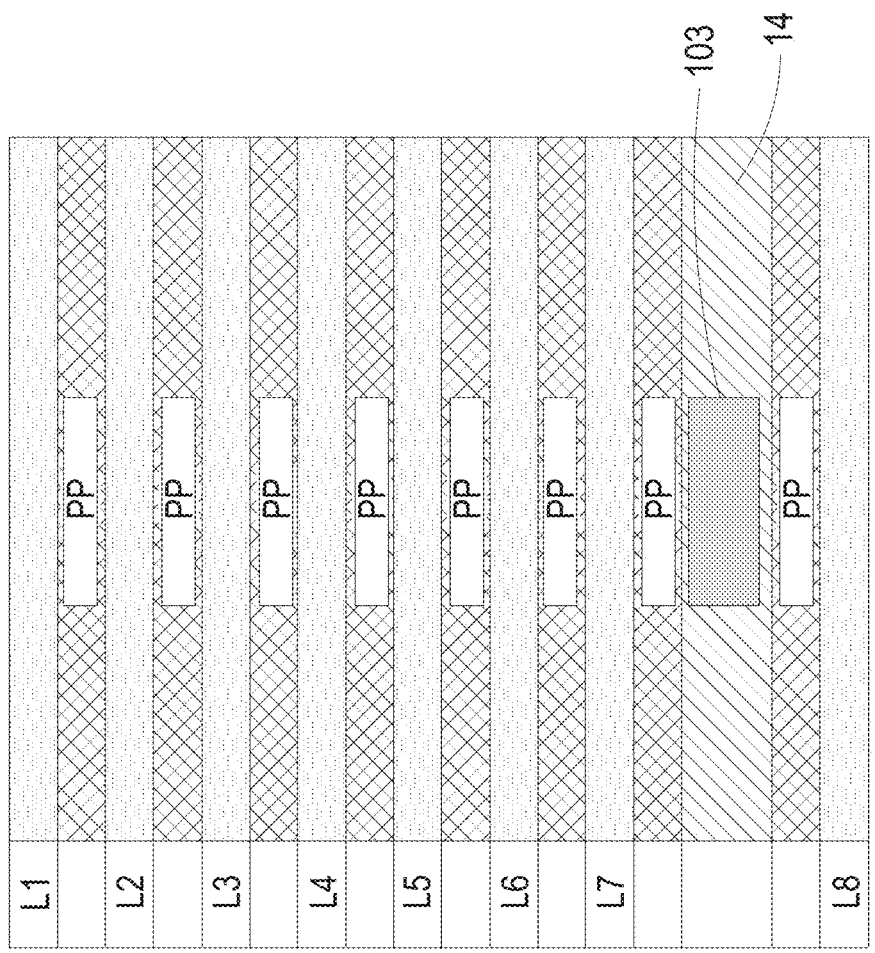
FIG. 3 is a schematic side view illustrating the power converter module according to the embodiment of the present disclosure.
Figure 4:
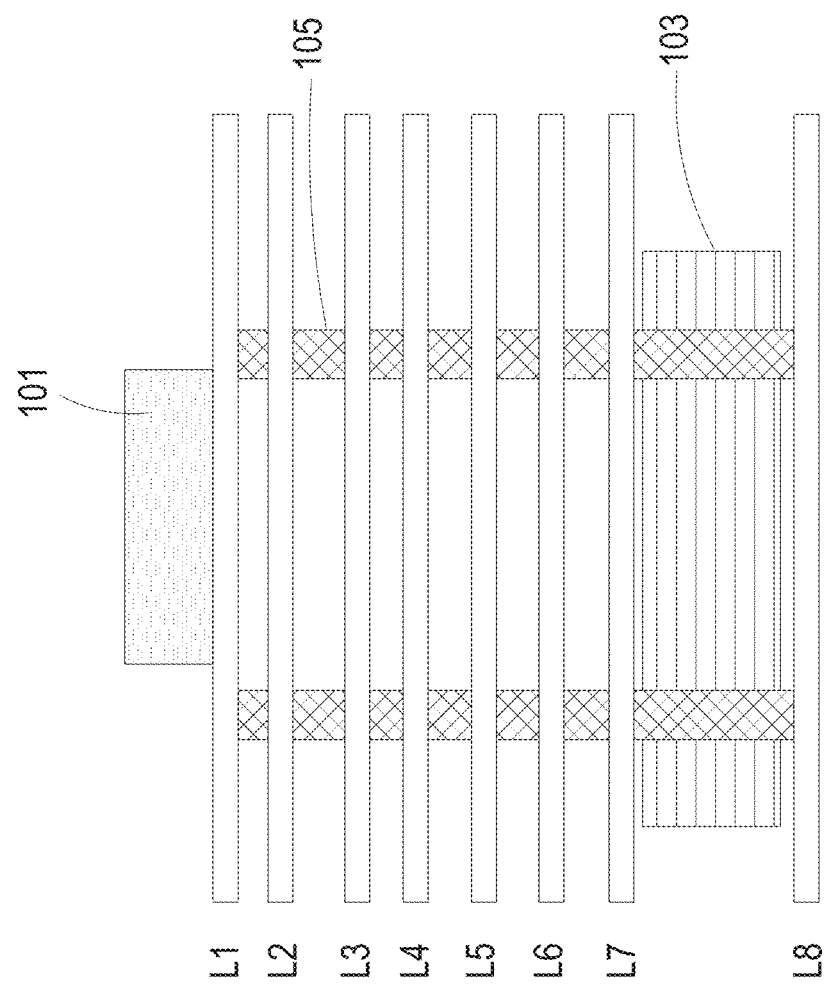
FIG. 4 is a schematic side view illustrating the power converter module according to the embodiment of the present disclosure.

FIG. 1 is a schematic perspective view illustrating a power converter module according to an embodiment of the present disclosure. FIG. 2 is an exploded view illustrating the power converter module according to the embodiment of the present disclosure. FIG. 3 is a schematic side view illustrating the power converter module according to the embodiment of the present disclosure. FIG. 4 is a schematic side view illustrating the power converter module according to the embodiment of the present disclosure. As shown in FIGS. 1, 2, 3, and 4, the power converter module 1 includes a multilayer printed circuit board 10, at least one switching device 101, at least one capacitor device 102, at least one magnetic core element 103 and at least one winding via 105. The multilayer printed circuit board 10 has a first surface 11, a second surface 12 and an inside layer 14. The first surface 11 and the second surface 12 are opposite, and the multilayer printed circuit board 10 includes a plurality of copper layers L1 to L8. The switching device 101 is disposed on the first surface 11 of the multilayer printed circuit board 10. The magnetic core element 103 is disposed in the inside layer 14 of the multilayer printed circuit board 10, and the magnetic core element 103 has at least one hole 104. A first end of the winding via 105 is electrically connected to the switching device 101, and a second end of the winding via 105 is electrically connected to the second surface 12 of the multilayer printed circuit board 10. The winding via 105 penetrates through the hole 104 of the magnetic core element 103 and forms a magnetic assembly with the magnetic core element 103. The winding via 105 is electrically connected to all or a part of the copper layers L1 to L8. The capacitor device 102 is disposed on the first surface 11 of the multilayer printed circuit board 10. The capacitor device 102 includes at least one capacitor, and the capacitor is an input capacitor or an output capacitor. In an embodiment, the winding via 105 is a straight hole or a stepped hole, more specifically, the winding via 105 may have a straight structure or a partially bent structure. The amount of the copper layers on a first side of the magnetic core element 103 close to the first surface 11 of the multilayer printed circuit board 10 is at least two more than the amount of the copper layers on a second side of the magnetic core element 103. In an embodiment, the amount of the copper layers on the first side of the magnetic core element 103 close to the first surface 11 of the multilayer printed circuit board 10 is at least three more than the amount of the copper layers on the second side of the magnetic core element 103. As shown in FIGS. 3 and 4, the multilayer printed circuit board 10 includes eight copper layers L1 to L8 and eight dielectric layers PP. The dielectric layer PP is disposed between the two adjacent copper layers, however, the actual amount of the layers of the multilayer printed circuit board 10 is not limited thereto. In an embodiment, the magnetic core element 103 is disposed between the copper layers L7 and L8 of the multilayer printed circuit board 10. As a result, the amount of the copper layers L1 to L7 on the first side of the magnetic core element 103 close to the first surface 11 of the multilayer printed circuit board 10 is more than the amount of the copper layer L8 on the other second side of the magnetic core element 103, and the copper layers L1 to L7 can have a larger wiring area and a larger copper laying area. Since the amount of the copper layers on one side of the magnetic core element 103 is more than the amount of the copper layers on the other side of the magnetic core element 103 (e.g., by two), a larger amount of copper layers concentrated on one side of the magnetic core element 103 can be used to obtain a larger wiring area and a larger copper laying area. Accordingly, enough space for wiring is provided to avoid the strong electromagnetic field interference caused by the power loop. Moreover, the flexibility of the copper laying network is increased, and the parasitic resistance and parasitic inductance of the multilayer printed circuit board are reduced, thereby improving the efficiency of power converter module.

Figure 5:
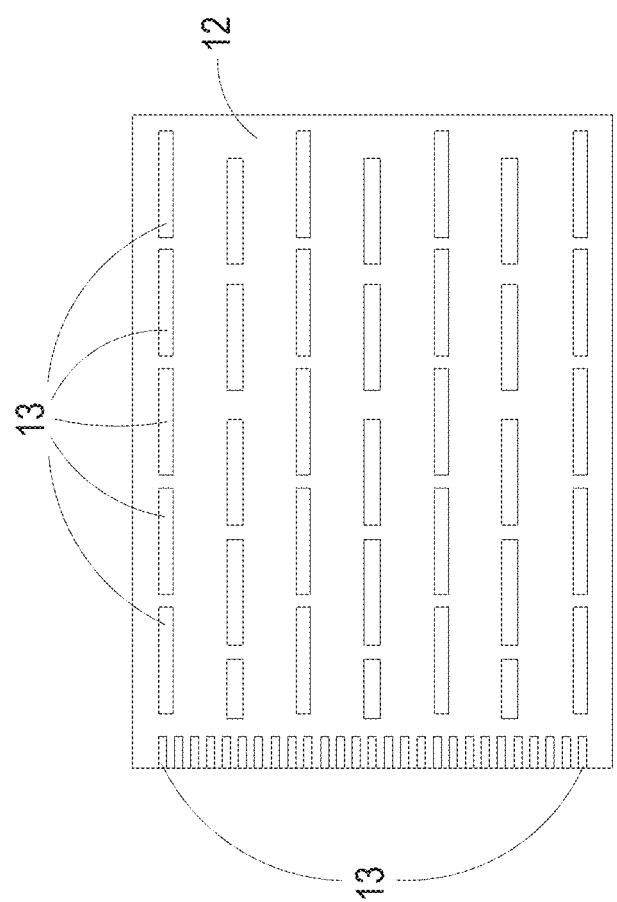
FIG. 5 is a schematic view illustrating the second surface of the power converter module according to the embodiment of the present disclosure.

FIG. 5 is a schematic view illustrating the second surface of the power converter module according to the embodiment of the present disclosure. In an embodiment, as shown in FIG. 5, the power converter module 1 further includes at least one pad 13, and the at least one pad 13 is disposed on the second surface 12 of the multilayer printed circuit board 10. The pad 13 is a copper block pin or the surface copper skin of the multilayer printed circuit board 10. The pad 13 is fixed on the second surface 12, and the second end of the winding via 105 is electrically connected to the pad 13.

Figure 6:
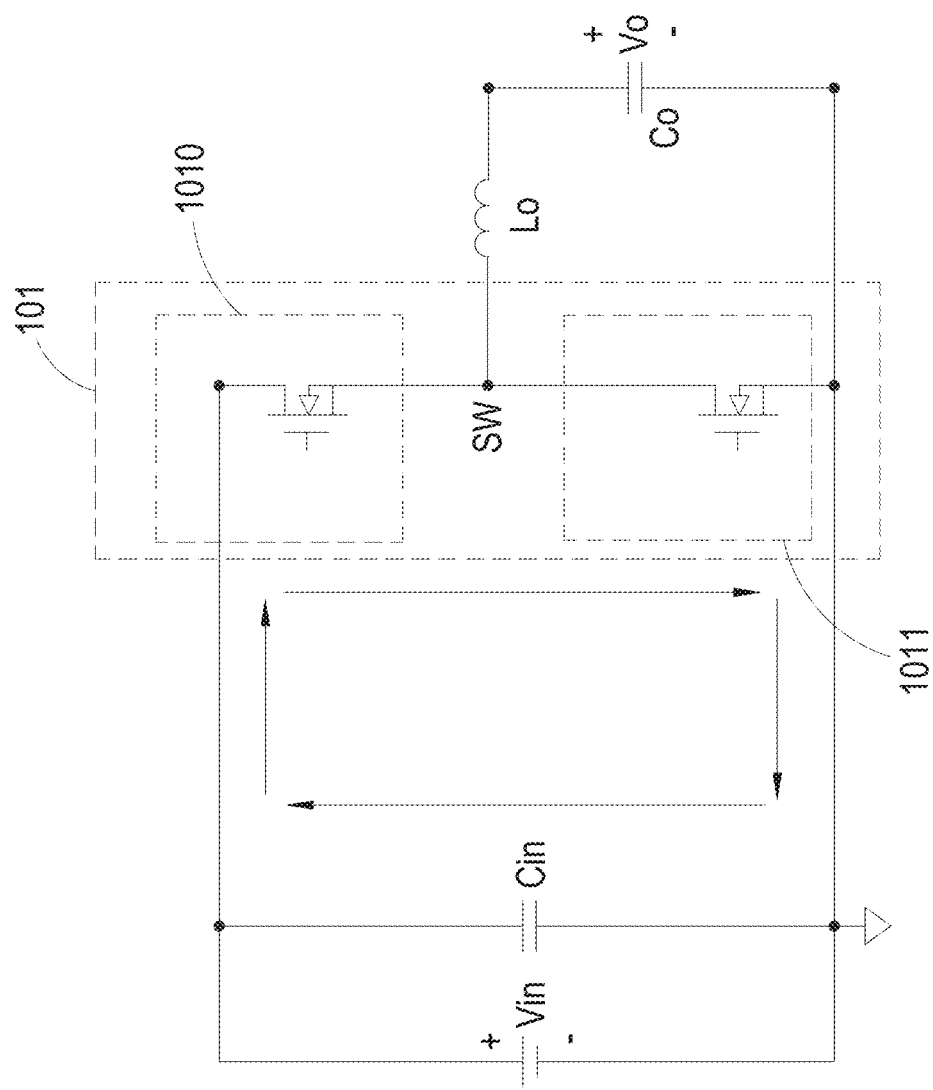
FIG. 6 is a schematic equivalent circuit diagram illustrating the power converter module of the present disclosure.

FIG. 6 is a schematic equivalent circuit diagram illustrating the power converter module of the present disclosure. As shown in FIG. 6, the capacitor device 102 includes an input capacitor Cin and an output capacitor Co, the magnetic assembly is an inductor Lo, and the winding via 105 is served as the winding of the inductor Lo. The switching device 101 includes at least one upper switch 1010 and at least one lower switch 1011 electrically connected to each other. The upper switch 1010 and the lower switch 1011 can be, for example, MOSFET (Metal Oxide Semiconductor Field Effect Transistor), but not limited thereto. A node SW is formed between the upper switch 1010 and the lower switch 1011, the node SW is electrically connected to the inductor Lo, and the node SW is electrically connected to the first end of the winding via 105. An end of the input capacitor Cin is electrically connected to the upper switch 1010 to form a positive input Vin+, the other end of the input capacitor Cin is electrically connected to the lower switch 1011 to form a negative input Vin−. Two ends of the output capacitor Co are connected to the inductor Lo and lower switch 1011, respectively. In an embodiment, the inductor Lo is regarded as the magnetic assembly of the above embodiment and is disposed in the inside layer 14 of the multilayer printed circuit board 10. The projections of the inductor Lo and the switching device 101 on the first surface 11 at least partially overlap with each other. The inductor Lo is electrically connected to the positive output Vo+ of the power converter module 1, and the positive output Vo+ is disposed on the second surface 12 of the multilayer printed circuit board 10. It is noted that only single-phase half-bridge branch is shown in FIG. 6, however, the actual power converter module may include multiple-phase half-bridge branches connected in parallel.

Figure 7:
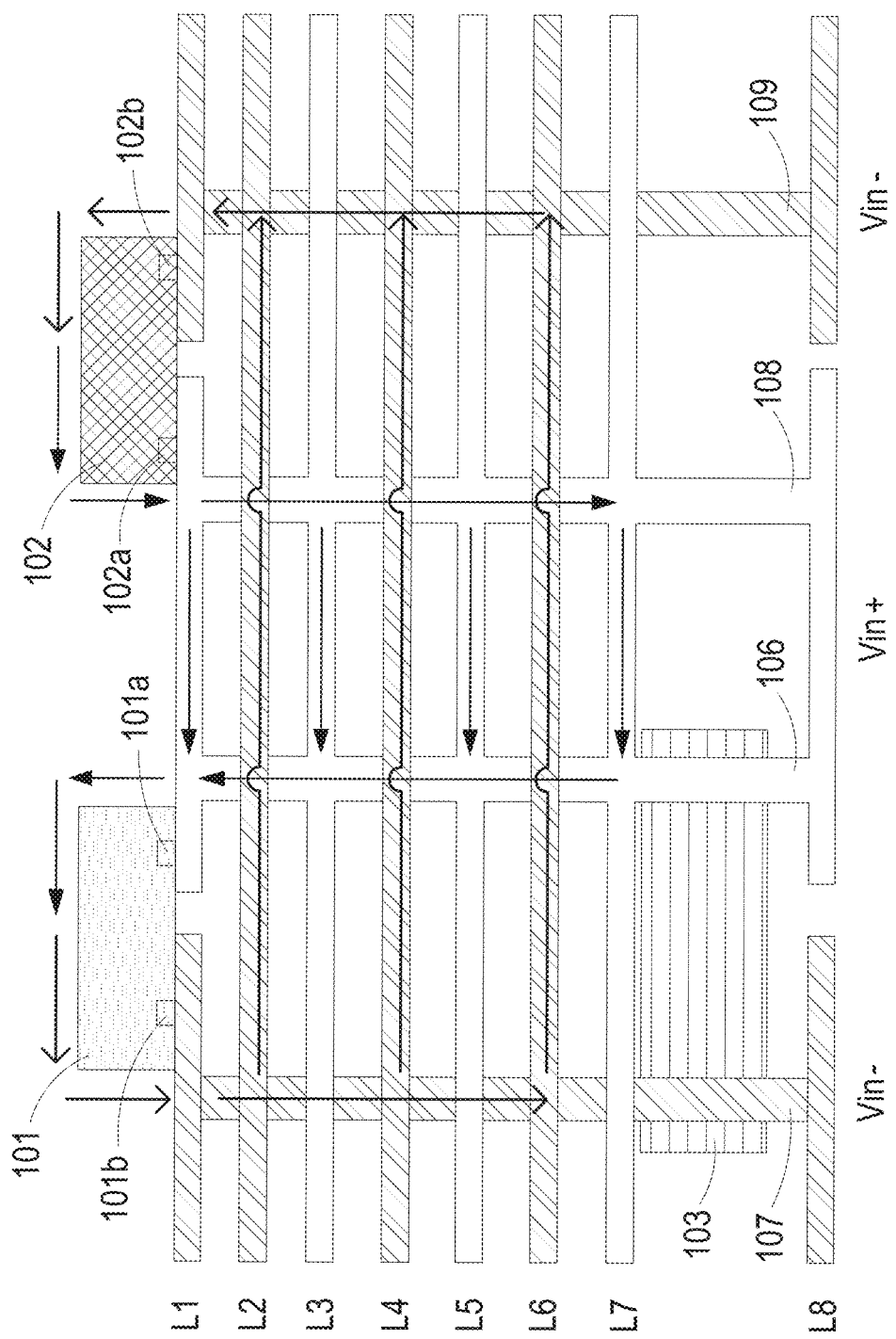
FIG. 7 is a schematic side view illustrating the power converter module according to another embodiment of the present disclosure.

FIG. 7 is a schematic side view illustrating the power converter module according to another embodiment of the present disclosure. The elements of FIG. 7 that are similar with those of FIG. 4 are represented by the same reference numerals, and the detailed description thereof is omitted herein. In the embodiment shown in FIG. 7, the plurality of copper layers include a plurality of positive copper layers and a plurality of negative copper layers, and the plurality of positive copper layers and the plurality of negative copper layers are disposed in staggered arrangement. In an embodiment, the positive copper layers include copper layers L3, L5, and L7, and the negative copper layers include copper layers L2, L4, and L6. The switching device 101 has a switching positive terminal 101a and a switching negative terminal 101b. The capacitor device 102 has a capacitor positive terminal 102a and a capacitor negative terminal 102b. The capacitor device 102 is disposed on the first surface 11 and is adjacent to the switching device 101, and the capacitor device 102 forms a capacitor area. The power converter module 1 further includes a first via 106, a second via 107, a third via 108 and a fourth via 109. The first via 106 is electrically connected to the switching positive terminal 101a, the second via 107 is electrically connected to the switching negative terminal 101b, the third via 108 is electrically connected to the capacitor positive terminal 102a, and the fourth via 109 is electrically connected to the capacitor negative terminal 102b. The first via 106 and the third via 108 are electrically connected to a part of the copper layer L1 (i.e., the part of the copper layer L1 that is electrically connected to the switching positive terminal 101a and the capacitor positive terminal 102a), the copper layers L3, L5, L7, and a part of the copper layer L8 (i.e., the part of the copper layer L8 that is electrically connected to the positive input Vin+). The second via 107 and the fourth via 109 are electrically connected to a part of the copper layer L1 (i.e., the part of the copper layer L1 that is electrically connected to the switching negative terminal 101b and the capacitor negative terminal 102b), the copper layers L2, L4, L6, and a part of the copper layer L8 (i.e., the part of the copper layer L8 that is electrically connected to the negative input Vin−). The positive copper layers and the negative copper layers are disposed in staggered arrangement. The first via 106 and the third via 108 are electrically connected to the positive input Vin+, and the second via 107 and the fourth via 109 are electrically connected to the negative input Vin−. The positive input Vin+ and the negative input Vin− are disposed on the second surface 12 of the multilayer printed circuit board 10. The arrow line in FIG. 7 represents the direction of the AC current of this embodiment. The AC current loop of this embodiment is exemplified as follows. Taking the capacitor positive terminal 102a of the capacitor device 102 as a starting point, the AC current flows through the third via 108 and each positive copper layer, and then flows into the switching positive terminal 101a of the switching device 101 through the first via 106. Taking the switching negative terminal 101b of the switching device 101 as a starting point, the AC current flows through the second via 107 and each negative copper layer, and then flows into the capacitor negative terminal 102b of the capacitor device 102 through the fourth via 109. The direction of the AC current flowing through the positive copper layer is opposite to the direction of the AC current flowing through the adjacent negative copper layer. The overlapping parts of the first and third vias 106 and 108 and the copper layer L2, L4, and L6 shown in FIG. 7 only represent the front-to-rear relationship between the via and the copper layer under this viewing angle condition, rather than the actual connection. Similarly, the overlapping parts of the second and fourth vias 107 and 109 and the copper layers L3, L5, and L7 only represent the front-to-rear relationship between the via and the copper layer under this viewing angle condition, rather than the actual connection. The AC current flowing through the adjacent copper layers are in opposite directions so that the AC magnetic fluxes between the adjacent copper layers cancel each other out, thereby reducing the parasitic inductance of the current loop. Consequently, the conversion efficiency of the power conversion module is improved.

In addition, the power converter module 1 further includes a dielectric layer PP, and the dielectric layer PP is disposed between two adjacent copper layers. The projections of the adjacent positive and negative copper layers and the capacitor area on the first surface 11 at least partially overlap with each other, thereby reducing the parasitic inductance of wiring and reducing the parasitic loss. Therefore, the conversion efficiency of the power converter module 1 is improved. In an embodiment, the first via 106, the second via 107, the third via 108, and the fourth via 109 are straight holes or stepped holes.

In an embodiment, a part of the copper layer L8 is electrically connected to the positive output of the power converter 1, and a part of the copper layer L8 is electrically connected to the negative output of the power converter module 1.

In an embodiment, when the amount of the positive copper layer on the side of the magnetic core element 103 is one, and the amount of the negative copper layer is also one, the amount of the copper layers on one side of the magnetic core element 103 is two more than the amount of the copper layers on the other side of the magnetic core element 103.

It should be noted that the side view shown in FIG. 4 focuses on showing the position and connection relationships of the copper layers, the magnetic core element and the corresponding winding via. The side view shown in FIG. 7 focuses on showing the electrical connections of the positive and negative copper layers, the switching device and the capacitor device. In fact, the structures shown in FIGS. 4 and 7 can be implemented in different power converter modules or in the same power converter module.

From the above descriptions, the present application provides a power converter module. The amount of the copper layers on one side of the magnetic core element is more than the amount of the copper layers on the other side of the magnetic core element. Therefore, a larger amount of copper layers concentrated on one side of the magnetic core element can be used to obtain a larger wiring area and a larger copper laying area. Accordingly, enough space for wiring is provided to avoid the strong electromagnetic field interference caused by the power loop. Moreover, the flexibility of the copper laying network is increased, and the parasitic resistance and parasitic inductance of the multilayer printed circuit board are reduced, thereby improving the efficiency of power converter module. The present application provides a power converter module, by staggering the plurality of positive copper layers and the plurality of negative copper layers, and the plurality of positive copper layers and the plurality of negative copper layers are electrically connected to the corresponding switching positive and negative terminals, the capacitor positive and negative terminals, and a plurality of vias respectively. The projections of the adjacent positive and negative copper layers and the capacitor area on the first surface at least partially overlap with each other, thereby reducing the parasitic inductance of the wiring and reducing the parasitic loss. Therefore, the conversion efficiency of the power conversion module is improved.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An apparatus, comprising:
    a substrate, wherein the substrate has a first surface and a second surface, the first surface and the second surface are opposite, the substrate comprises a plurality of copper layers, the plurality of copper layers comprises M positive copper layers and N negative copper layers, and the positive copper layers and the negative copper layers are alternated, wherein M is equal to or greater than one, N is equal to or greater than one, and the sum of M and N is equal to or greater than three;
    at least one switching device disposed on the first surface of the substrate, wherein the switching device comprises a switching positive terminal and a switching negative terminal;
    at least one capacitor assembly disposed on the first surface of the substrate, wherein the capacitor assembly comprises a capacitor positive terminal and a capacitor negative terminal, and the at least one capacitor assembly forms a capacitor area;
    at least one first via, at least one second via, at least one third via and at least one fourth via, wherein the first via is electrically connected to the switching positive terminal, the second via is electrically connected to the switching negative terminal, the third via is electrically connected to the capacitor positive terminal, and the fourth via is electrically connected to the capacitor negative terminal, wherein the positive copper layers are electrically connected to the first via and the third via, and the negative copper layers are electrically connected to the second via and the fourth via;
    wherein projections of the adjacent positive and negative copper layers and the capacitor area on the first surface at least partially overlap with each other.

2. The apparatus according to claim 1, wherein a direction of a current flowing through each of the positive copper layers is opposite to a direction of a current flowing through the adjacent negative copper layer.

3. The apparatus according to claim 1, wherein the switching device comprises an upper switch and a lower switch electrically connected to each other, wherein a junction node is formed between the upper switch and the lower switch, and the at least one switching device is adjacent to the at least one capacitor assembly on the first surface of the substrate.

4. The apparatus according to claim 3, wherein the junction node is electrically connected to at least one inductor, projections of the inductor and the switching device on the first surface at least partially overlap with each other, the inductor is electrically connected to a positive output of the apparatus, and the positive output is disposed on the second surface of the substrate.

5. The apparatus according to claim 4, wherein a magnetic core element of the inductor is disposed in an inside layer of the substrate, and an amount of a part of the plurality of copper layers on a first side of the magnetic core element close to the first surface of the substrate is at least two more than an amount of a part of the plurality of copper layers on a second side of the magnetic core element.

6. The apparatus according to claim 4, wherein the substrate further comprises a winding via, the winding via is served as a winding of the inductor.

7. The apparatus according to claim 6, wherein the winding via is a straight hole.

8. The apparatus according to claim 1, wherein the first via and the third via are electrically connected to a positive input of the apparatus, and the second via and the fourth via are electrically connected to a negative input of the apparatus.

9. The apparatus according to claim 8, wherein the positive input and the negative input are disposed on the second surface of the substrate.

10. The apparatus according to claim 1, wherein the first via, the second via, the third via and the fourth via are straight holes or stepped holes.

11. A method of manufacturing an apparatus, the method comprising:
    providing a substrate having a first surface and a second surface opposite to each other, wherein the substrate comprises a plurality of copper layers, the plurality of copper layers comprises M positive copper layers and N negative copper layers, and the positive copper layers and the negative copper layers are alternated, wherein M is equal to or greater than one, N is equal to or greater than one, and the sum of M and N is equal to or greater than three;
    providing at least one switching device disposed on the first surface of the substrate, wherein the switching device comprises a switching positive terminal and a switching negative terminal;
    providing at least one capacitor assembly disposed on the first surface of the substrate, wherein the capacitor assembly comprises a capacitor positive terminal and a capacitor negative terminal, and the at least one capacitor assembly forms a capacitor area;
    providing at least one first via, at least one second via, at least one third via and at least one fourth via, wherein the first via is electrically connected to the switching positive terminal, the second via is electrically connected to the switching negative terminal, the third via is electrically connected to the capacitor positive terminal, and the fourth via is electrically connected to the capacitor negative terminal, wherein the positive copper layers are electrically connected to the first via and the third via, and the negative copper layers are electrically connected to the second via and the fourth via;
    wherein projections of the adjacent positive and negative copper layers and the capacitor area on the first surface at least partially overlap with each other.

12. The method according to claim 11, wherein the at least one switching device is adjacent to the at least one capacitor assembly on the first surface of the substrate.

13. The method according to claim 12, wherein projections of the inductor and the switching device on the first surface at least partially overlap with each other, the inductor is electrically connected to a positive output of the apparatus, and the positive output is disposed on the second surface of the substrate.

14. The method according to claim 13, wherein a magnetic core element of the inductor is disposed in an inside layer of the substrate, and an amount of a part of the plurality of copper layers on a first side of the magnetic core element close to the first surface of the substrate is at least two more than an amount of a part of the plurality of copper layers on a second side of the magnetic core element.

15. The method according to claim 13, further comprising: providing a winding via in the substrate, wherein the winding via is served as a winding of the inductor, and the winding via is a straight hole.

16. The method according to claim 11, wherein the first via and the third via are electrically connected to a positive input of the apparatus, and the second via and the fourth via are electrically connected to a negative input of the apparatus.

17. The method according to claim 16, wherein the positive input and the negative input are disposed on the second surface of the substrate.

18. The method according to claim 11, wherein the first via, the second via, the third via and the fourth via are straight holes or stepped holes.

* * * * *